United States Patent [19]

Slob

[11] Patent Number: 5,369,293
[45] Date of Patent: Nov. 29, 1994

[54] CHARGE-COUPLED DEVICE HAVING REDUCED CROSS-TALK

[75] Inventor: Arie Slob, Eindhoven, Netherlands

[73] Assignee: U.S. Philips Corporation, New York, N.Y.

[21] Appl. No.: 68,638

[22] Filed: Nov. 29, 1990

Related U.S. Application Data

[63] Continuation of Ser. No. 216,553, Jul. 7, 1988, abandoned.

[30] Foreign Application Priority Data

Jul. 10, 1987 [GB] United Kingdom ............... 8716236
Jul. 21, 1987 [NL] Netherlands ..................... 8701719

[51] Int. Cl.$^5$ .................................... H01L 29/78
[52] U.S. Cl. .......................... 257/241; 257/240; 257/243; 257/249
[58] Field of Search ............. 357/24, 24 M, 24 LR; 257/240, 241, 243, 249

[56] References Cited

U.S. PATENT DOCUMENTS

| | | | |
|---|---|---|---|
| 3,967,254 | 6/1976 | Kosonocky et al. | 357/24 |
| 4,131,950 | 12/1978 | van Santen | 357/24 LR |
| 4,306,221 | 12/1981 | Jiang et al. | 357/24 |
| 4,376,897 | 3/1983 | Byrne et al. | 357/24 |
| 4,380,056 | 4/1983 | Parrish et al. | 357/24 LR |
| 4,528,594 | 7/1985 | Kadekodi et al. | 357/24 LR |
| 4,528,596 | 7/1985 | Cope | 357/24 LR |
| 4,669,100 | 5/1987 | Slotboom et al. | 357/24 |
| 4,696,021 | 9/1987 | Kawahara et al. | 357/24 LR |

FOREIGN PATENT DOCUMENTS 52-32693 3/1977 Japan .................. 357/24 LR

OTHER PUBLICATIONS

Schlig, "A TDI Charge-Coupled Imaging Device for Page Scanning", Feb. 1986, pp. 182–186.

*Primary Examiner*—Ngan Van Ngo
*Attorney, Agent, or Firm*—Steven R. Biren

[57] ABSTRACT

A charge-coupled device has a series register (A) having charge storage electrodes (3a) for defining charge storage wells and charge transfer electrodes (3b) for transporting charge between the charge storage wells and a parallel section (C) having channels (1a,1b) extending transversely of the series register (A). The parallel section (C) has charge storage electrodes (11a,12a,13a ... Na) spaced apart along the channels, (1a,1b) to define a respective charge storage well with each channel to provide a respective row of charge storage wells extending transversely of the channels and has charge transfer electrodes (12b ... Nb) for transferring charge between adjacent rows of charge storage wells, and a transfer gate (T1) for transferring charge between the series register (A) and an adjacent row of charge storage wells defined by the channels (1a,1b) and a first charge storage electrode (11a) of the parallel section. The first charge storage electrode (11a) of the parallel section (C) is shaped so that, at least over each channel (1a,1b), the first charge storage electrode (11a) is wider than succeeding charge storage electrodes (12a, ... Na) of the parallel section (C).

6 Claims, 3 Drawing Sheets

CHARGE-COUPLED DEVICE HAVING REDUCED CROSS-TALK

This is a continuation of application Ser. No. 216,553, filed Jul. 7, 1988 now abandoned.

BACKGROUND OF THE INVENTION

This invention relates to a charge-coupled device having a series register and a parallel section, for example a charge-coupled device suitable for use as a series-parallel-series (SPS) memory device.

Charge-coupled devices are known which have a series register having charge storage electrodes for defining charge storage wells and charge transfer electrodes for transporting charge between the charge storage wells and a parallel section having channels extending transversely of the series register. The parallel section has charge storage electrodes spaced apart along the channels, each charge storage electrode extending transversely over the channels to define a respective charge storage well with each channel to provide a respective row of charge storage wells extending transversely of the channel. The parallel section also has charge transfer electrodes for transferring charge between adjacent rows of charge storage wells. A transfer gate is provided for transferring charge between the series register and an adjacent row of charge storage wells defined by the channels and a first charge storage electrode of the parallel section. Such charge-coupled devices may comprise part of a series-parallel-serial (SPS) charge-coupled device in which a further series register is provided so that one series register forms an input series register and the other an output series register of the device. Such SPS charge-coupled devices which are suitable for use as memories in which the channels of the parallel section form a memory matrix for analog or digital information which is introduced via the series input register and which can be read out via the series output register. Another form of charge-coupled device of the above-described type is an image sensor in which the charge stored in the parallel section corresponds to a received two-dimensional radiation pattern.

GB-B-2110874 describes such a charge-coupled device which may comprise an SPS memory device. As described in GB-B-2110874, the charge storage and charge transfer electrodes are provided as a two-level conductive pattern on a dielectric layer of the semiconductor body overlying a surface region of the semiconductor body in which the channels and charge wells are provided. The upper level providing the charge transfer electrode is of course insulated by dielectric material from the lower level providing the charge storage electrodes. As described in GB-B-2110874, the two-level conductive pattern is provided by depositing and patterning first and second layers of doped polycrystalline silicon. Although other conductive material, for example a metal such as aluminum may be used, the use of polycrystalline silicon has the advantage of enabling the use of thinner dielectric layers.

SUMMARY OF THE INVENTION

According to the present invention, there is provided a charge-coupled device, comprising a series register having charge storage electrodes for defining charge storage wells and charge transfer electrodes for transporting charge between the charge storage wells, a parallel section having channels extending transversely of the series register, the parallel section having charge storage electrodes spaced apart along the channels, each charge storage electrode extending transversely over the channels to define a respective charge storage well with each channel to provide a respective row of charge storage wells extending transversely of the channels, and having charge transfer electrodes for transferring charge between adjacent rows of charge storage wells, and a transfer gate for transferring charge between the series register and an adjacent row of charge storage wells defined by the channels and a first charge storage electrode of the parallel section, characterized in that the first charge storage electrode of the parallel section is shaped so that, at least over each channel, the first charge storage electrode is wider than succeeding charge storage electrodes of the parallel section.

It should be understood that the width of the charge transfer and storage electrode of the parallel section is to be taken to be the dimension measured along the channels.

The charge storage (and possibly also the charge transfer) electrodes of the series register overlap with the transfer gate, enabling cross-talk between clock signals applied to the series charge storage (and possibly also charge transfer) electrodes and to the transfer gate. Because the first charge storage electrode of the parallel section of a charge-coupled device embodying the invention is wider over each channel than succeeding charge storage electrodes, the possibilities of charge beneath the first charge storage electrode being unintentionally transferred to the series register because of such cross-talk may be minimized or reduced.

The increase in width of the first charge storage electrode is optimized to provide a reduction in cross-talk influence on charge transport without unduly influencing the overall rate of charge transport through the memory. The first charge storage electrode may be, for example, approximately 1.5 times the width of the succeeding charge storage electrodes.

The charge-coupled device may comprise a further series register having alternate charge storage and charge transfer electrodes, the further series register being separated from the series register by the parallel section, and a further transfer gate for transferring charge between the further series register and an adjacent row of charge storage wells defined by the channels and a second one of the charge storage electrodes of the parallel section. Thus, the series register may comprise an input series register and the further series register an output series register of the device so that the first transfer gate forms an input transfer gate for enabling charge to be input to the parallel section from the input series register and the second transfer gate forms an output transfer gate for enabling charge to be output from the parallel section, the second one of the charge storage electrodes thus forming the last charge storage electrode of the parallel section. The device may for example form part of an SPS memory or image sensor.

The second charge storage electrode may be shaped so that, at least over each channel, the second charge storage electrode is wider than preceding charge storage electrodes (except the first charge storage electrode) of the parallel section, thus enabling the possibilities of cross-talk between the charge transfer and storage electrodes of the further series register and the second transfer gate causing inadvertent and undesired transfer of charge between charge wells underlying the second charge storage electrode and the further series register to be minimized or at least reduced without unduly delaying transfer of charge packets through the device. The first charge storage electrode may be of uniform width.

In conventional SPS—memory devices, it is desirable for charge wells underlying alternate charge storage electrodes of the input and output series registers to be empty so as to avoid or reduce the possibilities of contamination or mixing of charge packets. Thus, as only half of the charge wells of the input or output series register can be accepted at one time whereas each charge well of a row of charge wells in the parallel section may be occupied at the same time, as described in U.S. Pat. No. 3,967,254, a technique known as interlacing is used on transfer from the input series register to the parallel section and a technique known as de-interlacing is used on transfer from the parallel section to the output register. Thus, in order to input a row of information to the SPS memory device, a first subsidiary row of information is first written into the series input register then transferred to charge wells beneath the first charge storage electrode, so occupying alternate charge storage wells of the first row, by applying an appropriate clock signal to the transfer gate then a second subsidiary row of information is written into the series register with the transfer gate blocking transfer between the series register and the parallel section and finally when the second subsidiary row of information has been written into the input series register, it is transferred by applying the appropriate clock signal to the transfer gate to the remaining charge wells of the first row so as to be interlaced with the first subsidiary row of information to form an interlaced row of information within the parallel section.

As will be appreciated from the above, a charge-coupled device embodying the invention may be particularly advantageous where such an interlacing technique is used as the first charge storage electrode serves to prevent or at least inhibit cross-talk causing transfer of an already transferred first subsidiary row of information back to the input series register during the writing of the second subsidiary row of information into the input series register.

In order that rows of information may be output in the same order as they are input to the memory device, it is necessary to de-interlace the first and second subsidiary rows of information. As described in U.S. Pat No. 3,967,254 this may be accomplished by providing an output stage consisting of two interdigitated comb-like charge storage electrodes.

In a charge coupled device embodying the invention, the second charge storage electrode may be of constant width and may be provided, for example, as a buffer as described in GB-B-2110874 between such a de-interlacing output stage and the output series register. Alternatively, the second charge storage electrode may comprise part of an output stage which also comprises another charge storage electrode, the second charge storage electrode having a first row of teeth and the said other charge storage electrode having a second row of teeth interdigitated with the first row, each tooth of the first row of teeth overlying a respective one of a first subsidiary group of alternate channels and each tooth of the second row of teeth overlying a respective one of a second subsidiary group of channels, a first charge transfer electrode extending across the channels for transferring charge from charge storage wells beneath the second row of teeth to charge wells defined by the second charge storage electrode and the second subsidiary group of channels and a second charge transfer electrode for transferring charge from charge wells defined by the first subsidiary group of channels and the said other charge storage electrode to charge wells beneath the first row of teeth.

Thus, the second charge storage electrode may fulfill two functions, firstly as part of the de-interlacing output stage and secondly to avoid or hinder cross-talk between the series output register charge transfer and storage electrodes and the transfer gate causing undesired transfer of charge from the de-interlacing output stage into the output series register.

The charge storage and transfer electrodes may be formed by a two-level conductive pattern for example of doped polycrystalline silicon which as indicated above enables thin dielectric layers to be used. Each transfer gate may similarly comprise a polycrystalline silicon strip. As will be appreciated, the resistivity of doped polycrystalline silicon is considerably higher (approximately 100 times) than that of aluminum and therefore the use of polycrystalline silicon transfer gates, while having advantages, further increases the possibility of cross-talk problems. Thus, a charge-coupled device embodying the invention having a first (and possibly also a second or last) charge storage electrode of the parallel section shaped so as to be wider over each channel is particularly useful where polycrystalline silicon electrodes, especially transfer gates are used.

A respective conductive strip may overlie the first and/or the second transfer gate and an insulating layer may separate each conductive strip from the underlying transfer gate, each conductive layer being electrically connected to the underlying transfer gate remote from the parallel section and serial register(s) of the device.

The use of such an additional conductive strip may be particularly advantageous where each transfer gate is formed of a relatively resistive material such as doped polycrystalline silicon as it serves to reduce delay time along the transfer gate and so again reduce possibilities of cross-talk causing undesired transfer of charge.

BRIEF DESCRIPTION OF THE DRAWING

An embodiment of the invention will now be described, by way of example, with reference to the accompanying drawing, in which.

Figure 1:
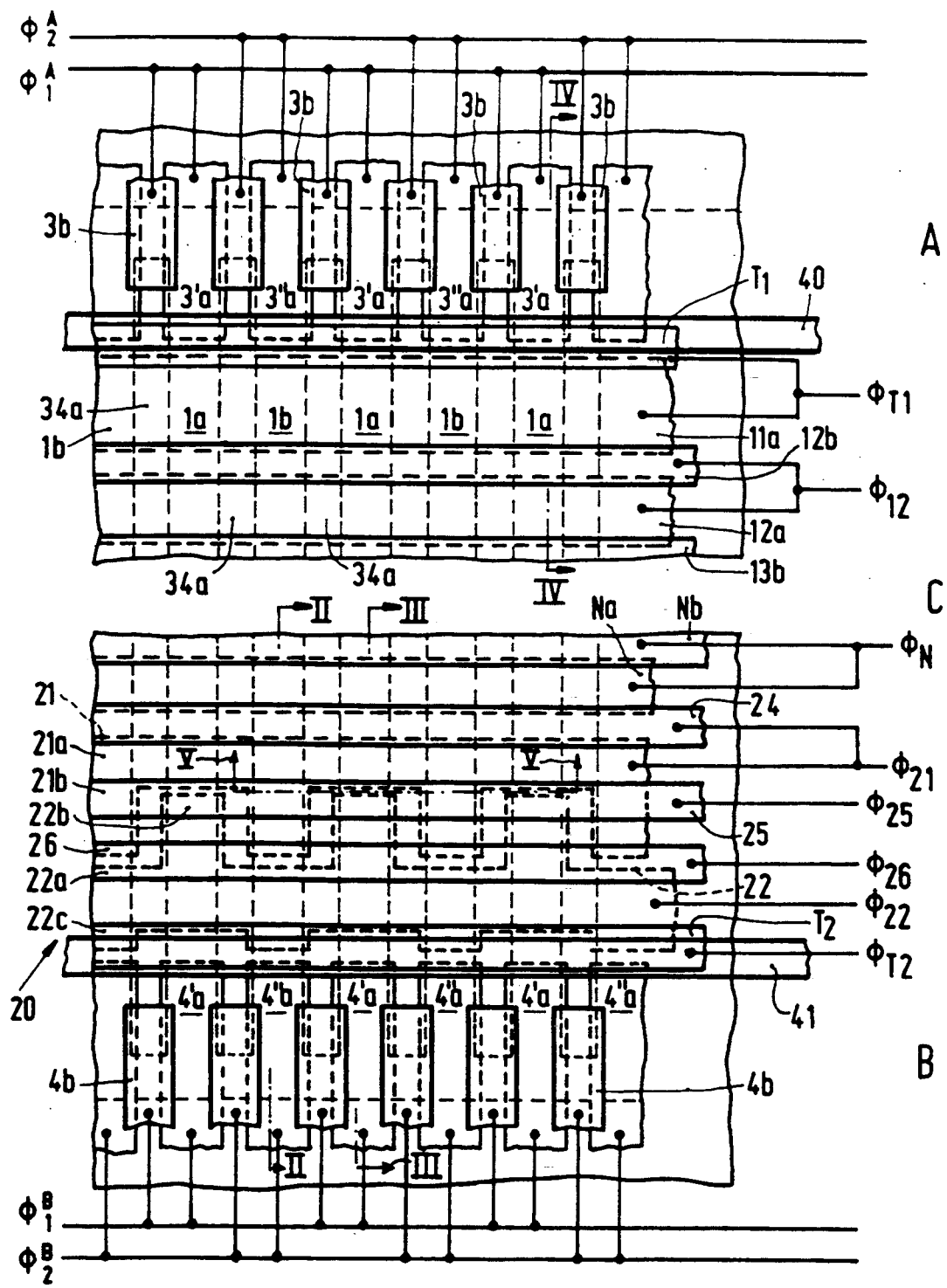
FIG. 1 is a plan view, in part cut-away, of part of a charge-coupled memory device embodying the invention.
Figure 2:
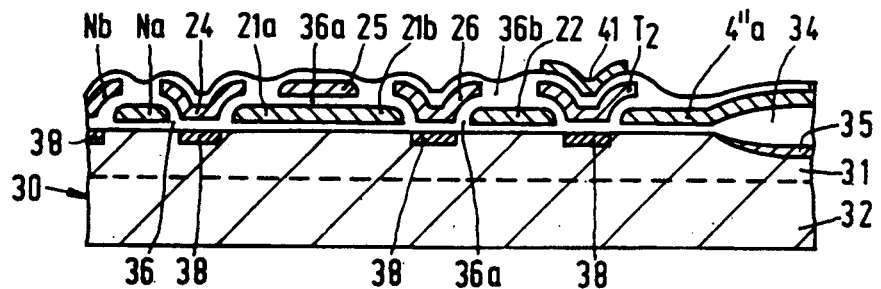
FIG. 2 is a cross-sectional view of the charge-coupled device of FIG. 1 taken along the line II—II in FIG. 1.
Figure 3:
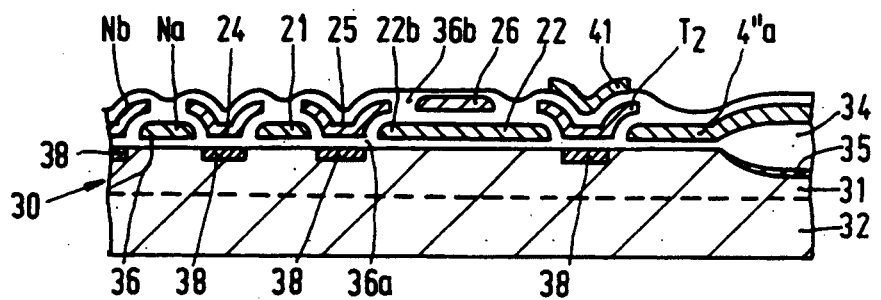
FIG. 3 is a cross-sectional view of the charge-coupled device of FIG. 1 taken along the line III—III in FIG. 1.
Figure 4:
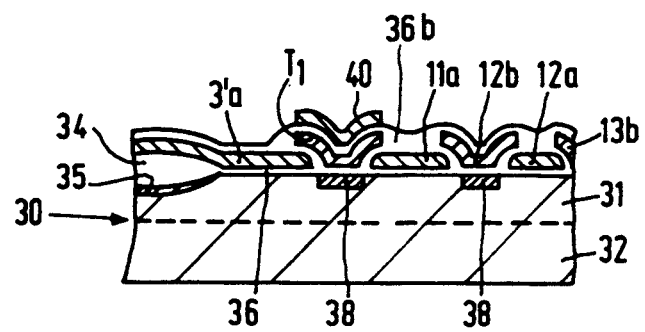
FIG. 4 is a cross-sectional view of the charge-coupled device of FIG. 1 taken along the line IV—IV in FIG. 1.
Figure 5:
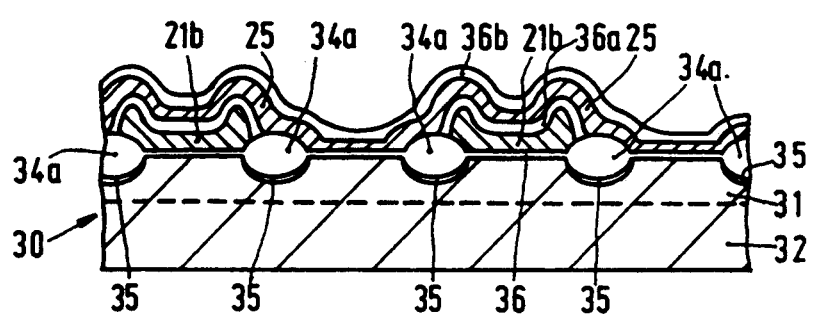
FIG. 5 is a cross-sectional view of the charge-coupled device of FIG. 1 taken along the line V—V in FIG. 1.

Referring to the drawings, it should first be noted that the Figures are diagrammatic and are not drawn to scale. In particular, certain dimensions, such as thickness, may have been exaggerated while other dimensions may have been reduced in the interests of clarity in the FIGS.

DESCRIPTION OF THE PREFERRED EMBODIMENTS

Figure 6:
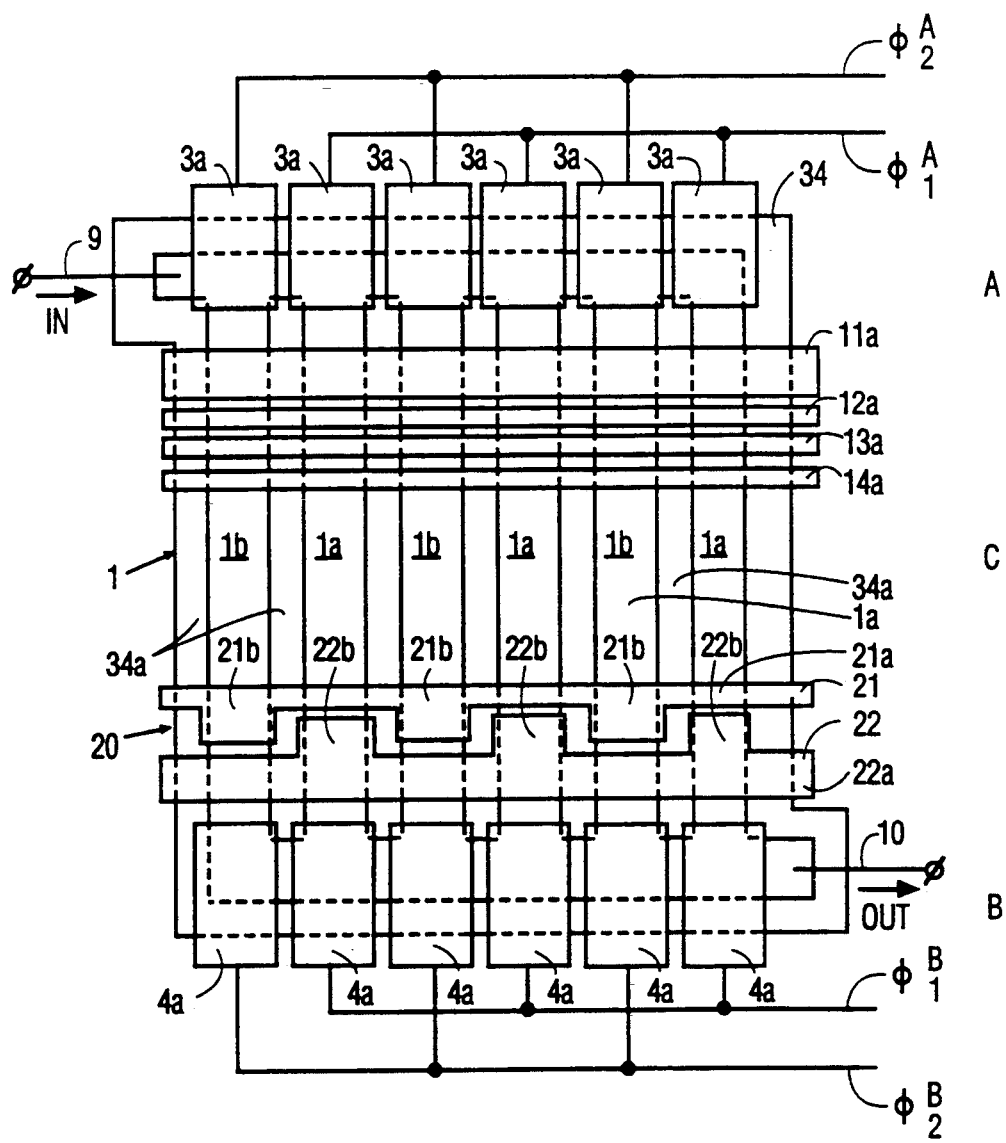
FIG. 6 is a schematic lay-out diagram of part of a serial-parallel-serial (SPS) memory device embodying the invention.

FIG. 6 illustrates schematically a lay-out diagram of a serial-parallel-serial (SPS) memory block which may form part of a larger memory device having, for example, 32 such SPS memory blocks.

As shown in FIG. 6, the SPS memory block of the SPS memory device comprises a series input register A, a series output register B and a parallel section C between the input and output registers A and B and which forms the actual memory matrix. FIG. 1 illustrates in more detail the charge-coupled device structure of part of a memory block.

Referring now to FIGS. 1 and 6, the series input register A comprises an input connection 9 (FIG. 6) and alternate charge storage and charge transfer electrodes 3a and 3b (in the interests of clarity, all transfer electrodes have been omitted in FIG. 6).

The passage of charge packets into the series input register A is controlled by clock signals on clock lines. In the arrangement shown in FIG. 1, a two-phase input series register A is provided and so two clock lines $\phi_1{}^A$ and $\phi_2{}^A$ are provided. The series output register B similarly comprises alternate charge storage and charge transfer electrodes 4a and 4b and again is a two-phase arrangement with two clock lines $\phi_1{}^B$ and $\phi_2{}^B$ provided for controlling movement of charge packets through the output series register to an output connection 10.

As is known in the art and as is described in GB-B-2110874, in a two-phase system associated charge transfer and storage electrodes are connected to the same controlling clock line (see FIG. 1) and the necessary assymetry to ensure charge transport in the required direction is provided by potential barriers of a known type beneath the charge transfer electrodes.

The parallel section C comprises a number of channels 1 running parallel to one another and transversely (as shown perpendicularly) of the series registers A and B. The channels 1 may be separated merely by channel stopper regions or as described below by field oxide strips with channel stopper regions underneath the field oxide strips. Although only six channels 1 are shown in FIG. 6, it should be appreciated that there will normally be many such channels, for example one hundred of such channels in an SPS memory block.

A number, which may be in the order of hundreds, of charge storage electrodes extend transversely across the parallel section C of the device so that each charge storage electrode defines with each underlying channel 1 a charge storage well so that rows of charge storage wells are provided extending transversely of the channels 1 and spaced apart along the channels 1. Charge transfer electrodes similarly extend across the channels for each transferring charge packets from a row of charge storage wells beneath an associated charge storage electrode to charge storage wells beneath the next charge storage electrode.

FIG. 6 illustrates diagrammatically only four charge storage electrodes 11a, 12a, 13a, 14a (the associated charge transfer electrodes not being shown in FIG. 6) while FIG. 1 illustrates charge storage electrodes 11a, 12a and Na and charge transfer electrodes 12b, 13b and Nb.

As indicated above, the charge storage electrodes 11a, 12a, ... Na define with the underlying channels 1 charge storage wells, each well providing a memory site of the memory block and the memory sites being arranged in a rectangular matrix.

Transfer of charge packets stored in one row of charge wells beneath one charge storage electrode to the next is controlled by clock signals applied to clock lines of the charge storage and charge transfer electrodes. Although the clock lines for supplying signals for controlling the movement of charge packets from row to row through the parallel section may provide a two, three or four phase system, preferably the parallel section C is controlled as a multi-phase or ripple system with every tenth charge transfer electrode and every tenth charge storage electrode of the parallel section C being connected to the same clock line so that, as described inter alia in U.K. Patent Specification No 2105111B, nine out of ten successive storage sites in each group are filled with information, while the tenth remains empty. By moving the empty place from the bottom to the top (FIGS. 1 and 6) the information can be moved from the top to the bottom step by step. The advantage of this mode of operation is the high information density which can be obtained in the parallel section in that only one empty site occurs in every ten sites.

Again, associated charge storage and transfer electrodes are controlled by the same clock line and the necessary assymmetry provided by potential barriers under the charge transfer electrodes. In the arrangement shown in FIG. 1, a first or input charge transfer gate T1 and the first charge storage electrode 11a of the parallel section are associated with a clock line $\phi_{T1}$ which does not form part of the ripple clock system but provides a clocking signal for transferring information from the input series register A to the parallel section C. The following charge storage electrodes 12a, 13a, ... Na and associated charge transfer electrodes 12b, 13b ... Nb are connected to clock lines $\phi_{12}, \ldots \phi_N$ of the ripple clock system.

A second or output transfer gate T2 is similarly provided for transferring charge packets from the parallel section C to the series output register B.

In the arrangement shown in FIGS. 1 and 6, a respective channel 1 is associated with each charge storage electrode 3a, 4a of the series input register A and the series output register B enabling charge packets to be transferred from under each of the charge storage electrodes 3a of the series input register A to the parallel section C, transported along the associated channel 1 and transferred to the charge well underlying the associated charge storage electrode 4a of the series output register B ready for output from the memory block or charge-coupled device. Such an arrangement enables maximum information density to be obtained. However, it is not possible for the charge storage wells underlying adjacent charge storage electrodes 3a of the series registers A and B to be full at the same time, rather full sites need to alternate with empty sites.

Thus, when information is being input to the series input register A, a first subsidiary row of information is moved as charge packets into the series input register A, under the control of the clock pulses applied to the clock lines $\phi_1{}^A$ and $\phi_2{}^A$, so that only charge storage wells underlying alternate charge storage electrodes 3'a are filled, These charge packets are then all transferred at the same time by applying a clock pulse to a clock line $\phi_{T1}$ of the first transfer gate T1, to respective charge storage wells beneath the first charge storage electrode 11a.

As charge packets are present only in alternate charge storage wells of the input series register A, only the charge storage wells of alternate channels 1a of the first row of charge storage wells beneath the first charge storage electrode 11a are filled. The alternate channels 1a form a first subsidiary group of channels.

With the first subsidiary row of information stored in the charge wells of the first subsidiary group of channels 1a, a second subsidiary of the row of information to be stored is moved, as charge packets, into the charge storage wells underlying the remaining charge storage electrodes 3″a of the series input register A under the control of the clock pulses applied to the clock lines $\phi_1^A$ and $\phi_2^A$. When the second subsidiary row of information has been stored under the electrodes 3″a, it is transferred, by applying the appropriate clock signal to the clock line $\phi_{T1}$ of the first transfer gate $T_1$, to the parallel section C from charge wells under the electrodes 3″a to the charge storage wells defined by the remaining or second subsidiary group 1b of channels and the overlying first charge storage electrode 11a. The charge packets constituting the two subsidiary rows of information are thus interlaced to define a row of information within the parallel section C and may then be transported in parallel through the parallel section C as will be described below.

There is a possibility of cross-talk between the signals applied to the clock lines $\phi_1^A$ and $\phi_2^A$ of the charge storage electrodes 3a (and possibly also of the charge transfer electrodes if, contrary to the arrangement shown, the charge transfer electrodes 3b overlap with the transfer gate $T_1$) of the series input register and the signal applied to the clock line $\phi_{T1}$ which may cause improper transfer of the charge packets from the parallel section C. Thus, in the arrangement shown in the FIGS., when, for example, a first subsidiary row of information has been transferred to the charge storage wells under the first charge storage electrode 11a, cross-talk between the clock signals applied to the clock lines $\phi_1^A$ and $\phi_2^A$ controlling transfer of the second subsidiary row of information into the series input register A and the clock signal applied to the clock line $\phi_{T1}$ of the first transfer gate $T_1$ may cause the charge packets already stored under the first charge storage electrode 11a to move back into the series input register A which is of course undesirable. In order to avoid or lessen the possibilities of charge packets being accidently transferred between charge wells of the series input register A and the first charge storage electrode 11a by such cross-talk, the first charge storage electrode 11a is shaped so as, at least over the entire width of each channel 1, to be wider than succeeding charge storage electrodes 12a, 13a ... Na of the ripple clock controlled part of the parallel section C. This makes it more difficult for the charge packets stored in relatively wide charge storage wells under the first charge storage electrode 11a to return to the series input register A because, for a charge packet of given size, the wider wells are filled to a lower level than the wells defined by the succeeding charge storage electrodes 12a, 13a, ... Na so that a higher voltage noise signal would be needed to cause a charge packet to be accidentally transferred out of the wider well back to the input series register. As shown in FIG. 1, the first charge storage electrode 11a is of uniform width, although it is really only necessary for the first charge storage electrode 11a to be wider than the succeeding charge storage electrodes over the channels 1 and not over the field oxide strips 34a. If the first charge storage electrode 11a is only wider than the succeeding charge storage electrodes of the parallel section over the width of the channels 1, then each wider part of the first charge storage electrode 11a should extend over a sufficient length of the first charge storage electrode to cover the entire width of the associated channel 1 and preferably overlap slightly with the field oxide strips 34a bounding the channel 1.

The increase in width of the first charge storage electrode 11a is optimized to provide reduction in cross-talk influence on charge transport without unduly influencing the overall rate of charge transport through the memory. The first charge storage electrode may be, for example, approximately 1.5 times the width of the succeeding charge storage electrodes 12a, 13a, ... Na.

As mentioned above, the series output register B is similar to the series input register A, (being controlled by clock signals on pulses on clock lines $\phi_1^B$ and $\phi_2^B$) and accordingly only a subsidiary row of information can be read out of the memory block into the output series register B at one time. It is, of course, normally desirable that information exit the memory block in the order in which it entered the memory block and accordingly the ripple clock controlled part of the parallel section C is followed, as shown in FIGS. 1 and 6, by an output stage 20 for effecting 'de-interlacing' of the subsidiary rows of information to enable a first subsidiary row to be transferred out of the memory block via the output series register B followed by the second associated subsidiary row.

As shown in FIGS. 1 and 6, the output stage 20 comprises first and second toothed and interdigitated electrodes 21 and 22 and three associated charge transfer electrodes 24, 25, and 26 (not shown in FIG. 6).

The charge storage electrode 22 forms a final charge storage electrode of the parallel section C and, as shown, the final charge storage electrode 22, like the first charge storage electrode 11a, is wider over the entire width of each channel 1 than the remaining charge storage electrodes. In this example, in the case of the first charge storage electrode 11a, this widening is achieved by making the first charge storage electrode 11a of a constant or uniform width. The final charge storage electrode 22 is however not of constant width. As shown in FIG. 1, the final charge storage electrode 22 comprises a spine or strip-like portion 22a which extends across the channels 1, a first row of teeth 22b projecting from one side of the spine portion so that each tooth overlies a respective one of the first subsidiary group 1a of channels and a further row of teeth 22c projecting from the other side of the spine portion 22a and offset from the first row of teeth 22b so that each tooth of the further row of teeth 22c overlies a respective channel of the second subsidiary group of channels 1b.

As shown, the teeth of the first row 22b are somewhat longer than the teeth of the further row 22c. This is because the teeth of the first row 22b are required to perform the de-interlacing whereas the further row of teeth 22c is provided so that the last charge storage electrode 22 is wider over each channel than the other charge storage electrodes (except the first one) of the parallel section C for the reasons mentioned above with reference to the first charge storage electrode 11a. The width of the charge storage electrode 22 across the teeth of the further row 22c may be 1.5 times that of the charge storage electrodes 12a, 13a ... Na while the width across the teeth of the first row 22b may be three times the width of the charge storage electrodes 12a, 13a . . . Na. The spine portion 22a of the final charge storage electrode 22 may be of similar width to the charge storage electrodes 12a, 13a . . . Na.

An alternative to the arrangement shown in FIG. 1 is illustrated schematically in FIG. 6. As shown in FIG. 6, the spine portion 22a is of uniform width and the row of teeth 22c is therefore not provided. The width of the spine portion 22a may be 1.5 times that of the charge storage electrodes 12a, 13a, . . . Na.

The other charge storage electrode 21 of the output stage comprises a spine portion 21a and a second row of teeth 21b extending extends towards and interdigitated with the teeth of the first row of teeth 22b of the charge storage electrode 22 so that each tooth of the second row of teeth 21b overlies a respective one of the second subsidiary group of channels 1b.

As can be seen from FIGS. 1 and 6 each tooth of the rows of teeth 22b, 22c and 21b extends over the entire width of the associated underlying channel 1 so as to overlap slightly onto the field oxide strips 34a bounding the channel.

As shown in FIG. 1, the first charge transfer electrode 24 of the output stage 20 extends over the channels 1 so as to overlap part of the charge storage electrode Na and also of the spine portion 21a of the charge storage electrode 21. The second charge transfer electrode 25 of the output stage 20 overlaps ends of the teeth of the first row of teeth 22b and the spine portion 21a of the charge storage electrode 21 while the third charge transfer electrode 26 of the output stage 20 overlaps ends of the teeth of the second row 21b and part of the spine portion 22a of the charge storage electrode 22.

The second or output transfer gate $T_2$ overlaps the row of teeth 22c and intermediate part of the spine portion 22a for transferring charge packets out of the series output register.

The structure of the charge-coupled device shown in FIG. 1 will now be described in greater detail with reference to FIGS. 1 to 5.

As shown most clearly in FIGS. 2 to 5, the device comprises a semiconductor body 30, in this example a p-type semiconductor body of monocrystalline silicon. The semiconductor body 30 may, for example, comprise at least a surface layer 31 having a comparatively low doping concentration of between $10^{15}$ and $10^{16}$ acceptor atoms per cm. This layer may cover the whole thickness of the semiconductor body but in another important embodiment it may also be provided as a comparatively high-ohmic layer having a thickness between 5 and 10 $\mu$m on a low-ohmic p-type substrate 32 having a doping concentration between $10^{19}$ and $10^{20}$ atoms per cm$^3$. As is known, this construction of the semiconductor body has the advantage that the leakage currents can be restricted. In FIGS. 2 to 5 this possible composition is indicated by the broken lines separating the epitaxial layer 31 from the substrate 32.

The channels 1a and 1b of the parallel section C and the channels of the series input and series output registers A and B are defined in the p-type layer 31. For this purpose, the surface of the semiconductor body has a field oxide pattern 34 (shown in broken lines in FIG. 1 and schematically by shading in FIG. 6 which covers a large part of the surface and has openings at the area of the channels 1a, 1b and the series registers A and B, strips 34a of the field oxide pattern separating adjacent channels 1a and 1b. Of course, although not shown in FIG. 6, the field oxide extends beyond the field oxide pattern 34 and may also have openings outside the part shown in the Figures in places where peripheral circuits are provided. The field oxide pattern 34, the thickness of which may be between 0.2 $\mu$m and 0.7 $\mu$m is formed in the present embodiment by means of local oxidation of the silicon body. In order to prevent parasitic channel formation, the doping concentration below the oxide pattern 34 is increased by providing p-type channel stopper zones 35 (FIGS. 2 to 5).

To provide the potential barriers necessary to provide assymmetry or directionality for charge flow in a two-phase system, p-type implantations 38 are provided beneath the transfer electrodes $T_1$, 3b, 4b, 12b . . . Nb, 24, 25, 26 and $T_2$.

The width of the channels 1a, 1b is, for example, approximately 2 $\mu$m, while the width of the field oxide strips 34a which separate the channels 1a and 1b from each other is, for example, approximately 2 $\mu$m.

At the area of the channels 1a and 1b the surface of the semiconductor body is covered with a thin dielectric layer, for example a silicon oxide layer 36 with a thickness of, for example, between approximately 0.02 $\mu$m and 0.08 $\mu$m.

The charge storage electrodes 3a, 4a, 11a . . . Na, 21 and 22 are provided, in this embodiment, by depositing and patterning a first doped polycrystalline silicon layer on the dielectric layer 36. A further thin layer of dielectric material, again for example a silicon oxide layer, 36a covers the charge storage electrodes defined by the first polycrystalline silicon layer and a second doped polycrystalline silicon layer is deposited and patterned to provide the charge transfer electrodes 3b, 12b . . . Nb, 24, 25, 26, 4b and transfer gates $T_1$ and $T_2$. The thickness of the dielectric layer 36a under the charge transfer electrodes and transfer gates may be approximately 0.03 $\mu$m. As illustrated in FIG. 1, the charge transfer electrodes of course overlap slightly the underlying charge storage electrodes and the teeth of the charge storage electrodes 21 and 22 forming the output stage 20 of the parallel section C similarly overlap onto the field oxide strips 34a so as to cover the entire width of the channels.

Further dielectric material, for example a further layer 36b of silicon dioxide is provided over the second polycrystalline silicon layer and conductive material, for example a metal such as aluminum, deposited to provide conductive tracks for the necessary connections.

First and second conductive tracks 40 and 41 extend over the first and second transfer gates $T_1$ and $T_2$, respectively. The conductive tracks 40 and 41 are connected to the respective transfer gates $T_1$ and $T_2$ outside the area of the device (not shown) and are provided to reduce delay which may otherwise occur because of the relatively high resistance (compared to aluminum) of the doped polycrystalline silicon electrodes. The conductive tracks 40 and 41 may be formed of aluminum.

Although only one charge-coupled device or memory block is shown in the FIGS., the complete memory device may consist of, for example, thirty-two such blocks with the charge storage and charge transfer electrodes for the parallel section C extending over all the blocks so that information can be transferred simultaneously from row to row in each memory block. In such an arrangement, the conductive tracks 40 and 41 will be connected to the underlying transfer gates $T_1$ and T$_2$, once between each block, enabling further reduction of possible delay time.

The operation of the memory block or charge-coupled device structure 1 shown in FIGS. 1 and 6 will now be briefly described.

As mentioned above, the number of elements (an element being considered as a charge storage electrode 3a or 4a and its associated charge transfer electrode 3b or 4b) is not important and may be any desired number, there being for practical purposes an upper limit of, for example, 320 elements. Where the memory block forms one of, for example, thirty-two parallel memory blocks of a video memory, then each row of the parallel section may be capable of storing a row of information consisting of 90 bits. The number of rows of information which the memory block can store will be determined by the number of elements (each element consisting of a charge storage electrode and its associated charge transfer electrode) of the parallel section of which there may be 320 (excluding the output stage 20). Where, as mentioned above, the parallel section is a multiphase or ripple type charge-coupled device with every tenth element being controlled by the same charge storage and charge transfer electrode clock pulses and one in ten rows of information thus being empty, the parallel section (omitting the output stage 20) may have 320 rows of information (i.e. 320 elements) providing a capability for storing $90 \times 32 \times 9$ bits of information.

The voltages applied to the clock lines of the device are assumed to vary between a low voltage $V_1$ (e.g. 0 v) and a high voltage $V_2$ (e.g. 5 v) while the substrate is at a substrate voltage $V_s$ (e.g. $-2.5$ v). In the arrangement being described, a charge packet is transferred from a charge well beneath one charge storage electrode to a charge well beneath the succeeding charge storage well when a low voltage $V_1$ is applied to the clock line associated with the one charge storage well and the high voltage $V_2$ is applied to the clock line associated with the succeeding charge storage well, enabling charge to flow over the potential barrier into the succeeding charge storage well where it remains when the voltage applied to the clock line associated with that well returns to the low level $V_1$.

By controlling the voltages applied to the clock lines $\phi_1^A$ and $\phi_2^A$ as described above, a first subsidiary row of information is transferred as charge packets into the input series register A to lie in charge wells beneath the charge storage electrodes 3'a. By application of a high voltage signal $V_2$ to the transfer gate $T_1$, this first subsidiary row of information is transferred, as described in GB-B-2105111, into charge wells defined by the channels 1a and the charge storage electrode 11a. A second subsidiary row of information is then moved into the input series register under the control of the signals on clock lines $\phi_1^A$ AND $\phi_2^A$ to occupy charge wells beneath the charge storage electrodes 3''a. When the second subsidiary row of information has thus been written into the input series register, it is transferred, by application of a high voltage signal $V_2$ to the transfer gate $T_1$, into charge wells defined by the channels 1b and the charge storage electrode 11a. The first and second subsidiary rows are thus interlaced.

The interlaced rows of information are moved through the parallel section by the ripple clocking system which is described in detail in GB-B-210511.

When interlaced rows of information are present in charge wells beneath the charge storage electrode Na, as described in GB-B-2110874, a high voltage signal $V_2$ applied to the clock line $\phi_{21}$, which is connected to the charge transfer electrode 24 and toothed charge storage electrode 21 of the output stage, causes the row of charge packets to be transferred to charge wells beneath the toothed charge storage electrode 21. The charge packets are thus stored alternately below the teeth 21b and below the narrow intervening parts of the spine 21c between the teeth 21b. By applying appropriate voltage signals to the clock line $\phi_{25}$ of the charge transfer electrode 25 and the clock line $\phi_{22}$ of the charge storage electrode 22, charge packets stored in wells defined by the spine 21a and channels 1a are transferred to charge wells beneath the teeth 22b of the charge storage electrode 22. The clock line $\phi_{26}$ of the charge transfer electrode 26 is held at a low voltage $V_1$ to prevent transfer of the charge packets in the wells defined between the channels 1b and the charge storage electrode 21. The first and second subsidiary rows of information are thus separated. The first subsidiary row of information can then be transferred to the series output register B by application of the appropriate clock signal to the transfer gate $T_2$. Whilst the first subsidiary row of information is being transferred to the output connection 10 under the control of voltage signals on the clock lines $\phi_1^B$ and $\phi_2^B$, the second subsidiary row of information can be transferred from the charge wells beneath the teeth 21b to charge wells defined by the spine 22a and channels 1b applying appropriate voltage signals to the clock lines $\phi_{26}$ and $\phi_{22}$. Once the first subsidiary row of information has been output to the output connection, the second subsidiary row may be transferred to the output series register B by application of a clock pulse to clock line $\phi T_2$ of the second or output transfer gate $T_2$ and then transferred to the output connection 10 under the control of the clock signals on lines $\phi_1^B$ and $\phi_2^B$.

A buffer may be provided between the de-interlacing output stage 20 and the output transfer gate $T_2$ as described in GB-B-2110874, Where such a buffer is provided, the teeth 22c may be omitted and the charge storage electrode of the buffer shaped so as to be wider over each channel then the charge storage electrode of the ripple clock controlled part of the parallel section, Such a buffer charge storage electrode may be of constant width along its length, Also, any other suitable method of de-interlacing the first and second subsidiary rows of information may be used, for example as described in U.S. Pat. No. 3,967,254. Furthermore, it is not necessary for rows of information to be interlaced in the SPS memory ,block, rather the rows can be separately transferred through the block with alternate channels of the parallel section C remaining empty, in which case no de-interlacing stage would be needed, although the last charge storage electrode of the parallel section C may still be widened (at least over each channel) for the reasons given above, Although in the arrangement described above, surface channel charge-coupled device structures are used, buried channel type charge-coupled device structures may also be used. Also, although the arrangement described above refers to serial-parallel-serial memories, the invention may be used in similar devices, for example in image sensors. Furthermore the invention may also be applicable where the semiconductor body is of n conductivity type, although appropriate changes to the voltages of the clock signals would be required. Similarly, the invention may be applicable where the semiconductor body is formed of a semiconductor material other than silicon, with appropriate consideration being given to the different properties of the semiconductor body and where the charge storage and charge transfer electrodes are formed of a conductive material or a composite of layers of different conductive material other than doped polycrystalline silicon.

From reading the present disclosure, other modifications will be apparent to persons skilled in the art. Such modifications may involve other features which are already known in the design of charge-coupled devices and which may be used instead of or in addition to features already described herein. Although claims have been formulated in the application to particular combinations of features, it should be understood that the scope of the disclosure of the present application also includes any novel feature or any novel combination of features disclosed herein either explicitly or implicitly or any generalization or modification of one or more of those features which would be apparent to persons skilled in the art, whether or not it relates to the same invention as presently claimed in any claim and whether or not it mitigates any or all of the same technical problems as does the present invention.

What is claimed is:

1. A charge-coupled device, comprising a series register having charge storage electrodes for defining charge storage wells and charge transfer electrodes for transporting charge between the charge storage wells, a parallel section having channels extending transversely from the series register, the parallel section having charge storage electrodes spaced apart along the channels, each charge storage electrode of said parallel section extending transversely over the channels to define a charge storage well within each channel to provide a row of charge storage wells extending transversely from the channels, the parallel section having charge transfer electrodes for transferring charge between adjacent charge storage wells, a transfer gate for transferring charge between the series register and an adjacent row of charge storage wells defined by the channels and a first charge storage electrode of the parallel section, the first charge storage electrode of the parallel section, which is the charge storage electrode closest to the series register, being shaped so that, at least over each channel, the first charge storage electrode is wider than succeeding charge storage electrodes of the parallel section, a further series register having alternate charge storage and charge transfer electrodes, the further series register being separated from the series register by the parallel section, and a further transfer gate for transferring charge between the further series register and an adjacent row of charge storage wells defined by the channels and a second one of the charge storage electrodes of the parallel section, wherein the series register comprises an input series register and the further series register comprises an output series register of the device, and wherein the second one of the charge storage electrodes comprises part of an output stage which also comprises another charge storage electrode, the second one of the charge storage electrodes having a first row of teeth and said another charge storage electrode having a second row of teeth interdigitated with the first row, each tooth of the first row of teeth overlying a respective one of a first subsidiary group of alternate channels and each tooth of the second row of teeth overlying a respective one of a second subsidiary group of channels, a first charge transfer electrode extending across the channels for transferring charge from charge storage wells beneath the second row of teeth to charge wells defined by the second one of the charge storage electrodes and the second subsidiary group of channels, and a second charge transfer electrode for transferring charge from charge wells defined by the first subsidiary group of channels and said another charge storage electrode to charge wells beneath the first row of teeth.

2. A charge-coupled device according to claim 1, wherein the second one of the charge storage electrodes is shaped so that at least over each channel, the second one of the charge storage electrodes is wider than preceding charge storage electrodes of the parallel section.

3. A charge-coupled device according to claim 1, wherein the first charge storage electrode is of uniform width.

4. A charge-coupled device according to claim 1, wherein each transfer gate comprises a polycrystalline silicon strip.

5. A charge-coupled device according to claim 1, wherein a respective electrically conductive strip overlies at least one of the transfer gate and the further transfer gate.

6. A charge-coupled device according to claim 5, wherein an insulating layer separates each conductive strip from the at least one of the transfer gate and the further transfer gate.

* * * * *